United States Patent
Gibo et al.

(10) Patent No.: US 7,123,730 B2
(45) Date of Patent: Oct. 17, 2006

(54) AUDIO POWER AMPLIFYING APPARATUS AND METHOD

(75) Inventors: Masao Gibo, Kyungki-do (KR); Won-suk Son, Kyungki-do (KR)

(73) Assignee: Bluetek Co., Ltd., Suwon (KR)

( * ) Notice: Subject to any disclaimer, the term of this patent is extended or adjusted under 35 U.S.C. 154(b) by 1057 days.

(21) Appl. No.: 10/041,673

(22) Filed: Jan. 10, 2002

(65) Prior Publication Data

US 2002/0159609 A1   Oct. 31, 2002

(30) Foreign Application Priority Data

Mar. 15, 2001 (KR) ............................... 2001-13450

(51) Int. Cl.
*H03F 21/00* (2006.01)
(52) U.S. Cl. ..................... 381/120; 330/255
(58) Field of Classification Search ............... 381/120; 330/255

See application file for complete search history.

(56) References Cited

U.S. PATENT DOCUMENTS 5,726,602 A * 3/1998 Brown ....................... 330/255

FOREIGN PATENT DOCUMENTS

| JP | 54-157459 | 12/1979 |
|---|---|---|
| JP | 57-037908 | 3/1982 |
| JP | 61-52815 | 4/1986 |
| JP | 61-19532 | 6/1986 |
| JP | 5-259749 | 10/1993 |
| JP | 10-313223 | 11/1998 |
| JP | 2001-44769 | 2/2001 |
| KR | 1993-7291 | 8/1993 |
| KR | 2001-22733 | 3/2001 |

OTHER PUBLICATIONS

Sanyo Electric Co, "STK4112II: AF Power Amplifier (Split Power Supply) (10W + 10W min, THD=0.4%)", Thick Film Hybrid IC, No. 2322, pp. 1-8 (Jul. 1997).

* cited by examiner

*Primary Examiner*—Brian T. Pendleton
(74) *Attorney, Agent, or Firm*—Staas & Halsey LLP (57) ABSTRACT

An audio power amplifying apparatus includes first through B-th power amplifying terminals, each of which power-amplifies an input alternating current (AC) audio input signal input and outputs the power amplified result as an audio output signal. A preamplifier of a b-th amplifying terminal divides the audio input signal into positive and negative portions to preamplify the positive and negative portions. A power supply supplies first through M-th positive and negative voltages having different levels. A power amplifier selects a positive supply voltage having a level proportional to a level of the preamplified positive portion and a negative supply voltage having a level proportional to a level of the preamplified negative portion and again amplifies the preamplified positive and negative portions using the selected positive and negative supply voltages to be combined by a signal synthesizer as the audio output signal.

15 Claims, 4 Drawing Sheets

AUDIO POWER AMPLIFYING APPARATUS AND METHOD

CROSS-REFERENCE TO RELATED APPLICATIONS

This application claims the benefit of Korean Application No. 2001-13450, filed Mar. 15, 2001, in the Korean Industrial Property Office, the disclosure of which is incorporated herein by reference.

BACKGROUND OF THE INVENTION

1. Field of the Invention

The present invention relates to audio signal processing, and more particularly, to an apparatus and method that amplifies the power of an audio signal.

2. Description of the Related Art

An example of many conventional audio power amplifiers that amplify the power of an audio input signal is an AF Power Amplifier (Split Power Supply) such as the STK4112II (hereinafter called a "conventional audio power amplifier"), which is a thick film hybrid integrated circuit (IC) amplifier manufactured by Sanyo Electric Co. Ltd.

The conventional audio power amplifier uses a high supply voltage when the level of an input audio signal is high, and a low supply voltage when the level of the audio signal is low so as to reduce power consumption required to amplify the power of the audio signal. For this purpose, a separate comparator is needed. The comparator determines the level of an input audio signal. Due to the comparator, the conventional audio power amplifier is expensive to manufacture, severely distorts the amplified audio signal, and causes high frequency noise to be produced due to the switching noise of the comparator, which may occur in switching and outputting different comparison results for each input audio signal.

Although the conventional audio power amplifier described above switches the supply voltage to only two levels according to the level of the audio signal, the amplifier may switch the supply voltage to more than two levels. In this case, additional comparators are needed, which aggravates the above problems due to the presence of the multiple comparators.

SUMMARY OF THE INVENTION

To solve the above and other problems, it is an object of the present invention to provide an audio power amplifying apparatus that linearly selects a supply voltage having a level proportional to the level of an audio input signal without using a comparator and to amplify the power of the audio input signal using the selected supply voltage.

It is another object of the present invention to provide an audio power amplifying method performed by the audio power amplifying apparatus.

Additional objects and advantages of the invention will be set forth in part in the description which follows and, in part, will be obvious from the description, or may be learned by practice of the invention.

In order to achieve the above and other objects, an audio power amplifying apparatus according to an embodiment of the present invention includes first through B-th power amplifying terminals, each of which power-amplifies an input alternating current (AC) audio input signal and outputs the power amplified result as an audio output signal.

According to another embodiment of the present invention, the b-th amplifying terminal ($1 \leq b \leq B$) of the audio power amplifying apparatus includes a preamplifier that divides the audio input signal into positive and negative portions to preamplify the positive and negative portions and outputs the preamplified positive and negative portions, a power supply to supply first through M-th positive and negative voltages having different levels, a power amplifier that selects a positive supply voltage having a level proportional to the level of the preamplified positive portion among the first through M-th positive voltages and a negative supply voltage having a level proportional to the level of the preamplified negative portion among the first through M-th negative voltages, amplifies the preamplified positive and negative portions again in response to the selected positive and negative supply voltages, respectively, and outputs the amplified positive and negative portions, and a signal synthesizer that combines the amplified positive and negative portions output from the power amplifier and outputs the combined result as the audio output signal.

According to a further embodiment of the present invention, an audio power amplifying method performed by a b-th power amplifying terminal ($1 \leq b \leq B$) of an audio power amplifying apparatus including the first through B-th power amplifying terminals, each of which power-amplifies an alternating current (AC) audio input signal input from the outside and outputs the power amplified result as an audio output signal. The audio power amplifying method includes dividing the audio input signal into positive and negative portions to preamplify the positive and negative portions and obtain the preamplified positive and negative portions, selecting a positive supply voltage having a level proportional to a level of the preamplified positive portion among first through M-th positive voltages having different levels, selecting a negative supply voltage having a level proportional to a level of the preamplified negative portion among first through M-th negative voltages having different levels, amplifying the preamplified positive and negative portions using the selected positive and negative supply voltages, respectively, and combining the amplified positive and negative portions to produce the audio output signal.

BRIEF DESCRIPTION OF THE DRAWINGS

The above and other objects and advantages of the present invention will become more apparent and more readily appreciated by describing in detail preferred embodiments thereof with reference to the accompanying drawings in which.

DETAILED DESCRIPTION OF THE EMBODIMENTS

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 1:
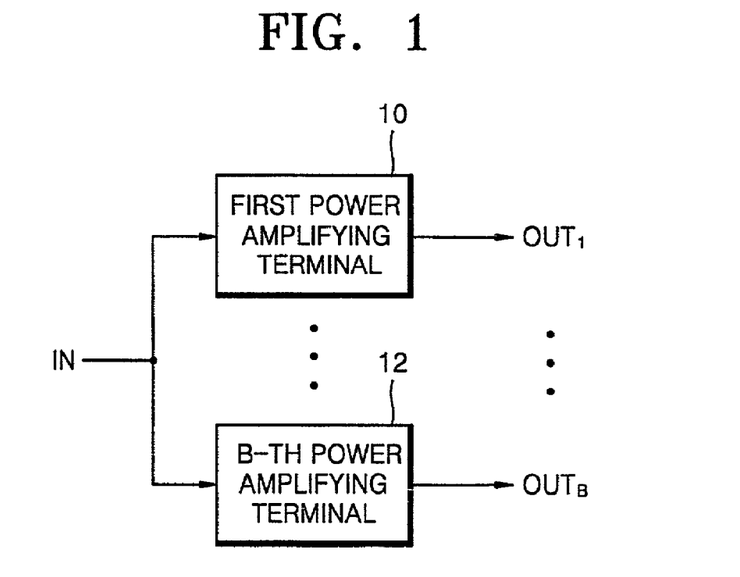
FIG. 1 is a schematic block diagram of an audio power amplifying apparatus according to an embodiment of the present invention.

Referring to FIG. 1, an audio power amplifying apparatus according to an embodiment of the invention includes first through B-th power amplifying terminals 10, . . . , and 12. Each of the first through B-th power amplifying terminals 10, . . . , and 12 amplifies the power of an input AC audio input signal received from an outside device via an input terminal IN, and outputs the power amplified result as an audio output signal to another output device such as a speaker (not shown) through a corresponding output terminal $OUT_1$, . . . , or $OUT_B$. For example, a b-th power amplifying terminal 10, . . . , or 12 amplifies the power of an AC audio input signal received from the outside through the input terminal IN, and outputs the power amplified result as an audio output signal through an output terminal $OUT_b$, where $1 \leq b \leq B$.

The configuration and operation of the b-th power amplifying terminal 10, . . . , or 12 according to an embodiment of the present invention and an audio power amplifying method performed by the b-th power amplifying terminal 10, . . . , or 12 according to the present invention will now be described with reference to FIGS. 2 and 3.

Figure 2:
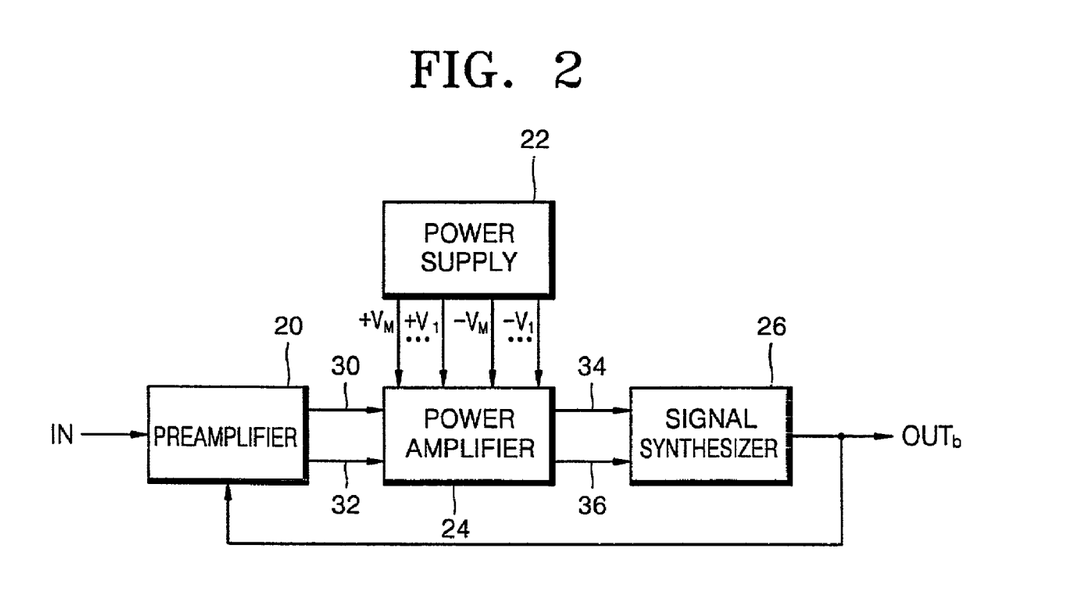
FIG. 2 is a block diagram of the b-th power amplifying terminal of FIG. 1.

FIG. 2 is a block diagram of the b-th power amplifying terminal 10, . . . , or 12 of FIG. 1 according to the present invention. Referring to FIG. 2, the b-th power amplifying terminal 10, or 12 includes a preamplifier 20, a power supply 22, a power amplifier 24, and a signal synthesizer 26.

Figure 3:
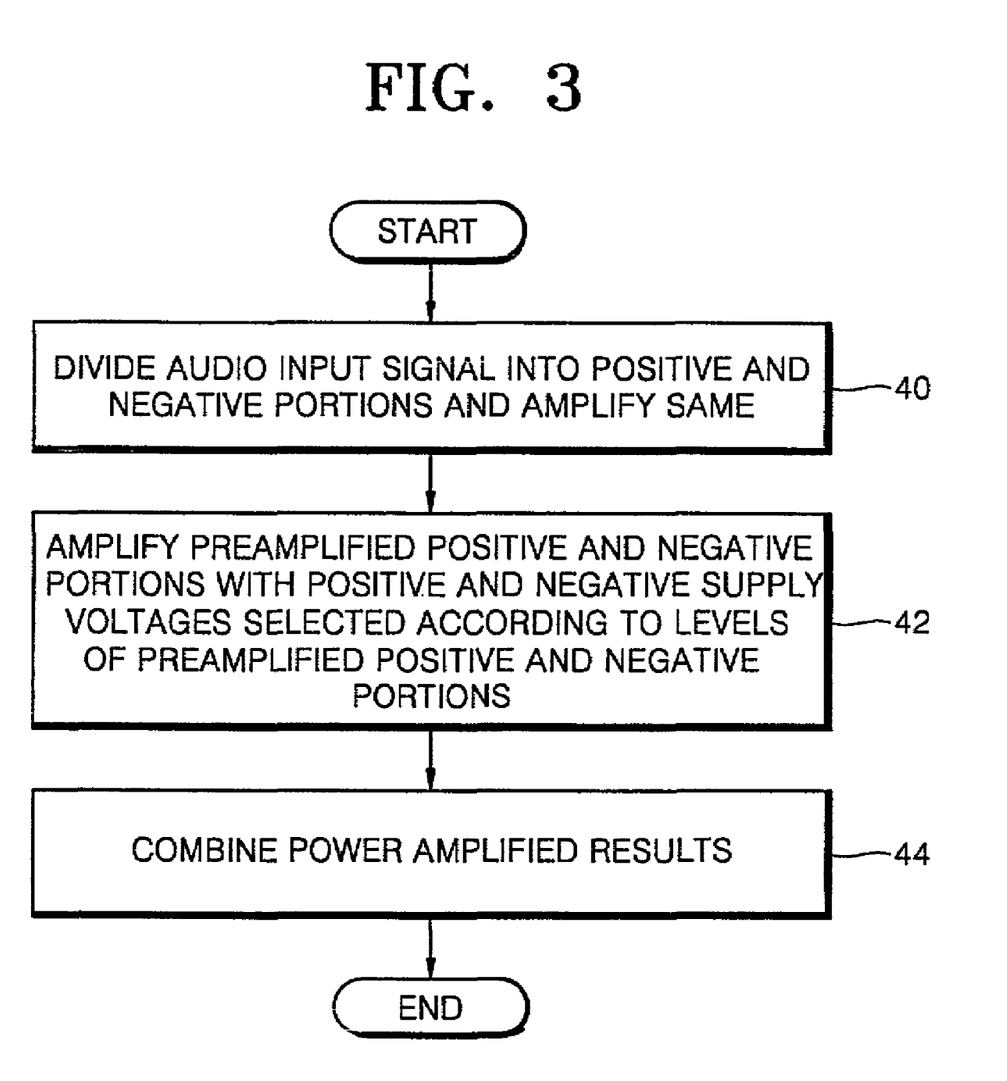
FIG. 3 is a flowchart of an audio power amplifying method according to an embodiment of the present invention performed by the b-th power amplifying terminal of FIG. 2.

FIG. 3 is a flowchart of an audio power amplifying method according to an embodiment of the present invention performed by the b-th power amplifying terminal of FIG. 2. Referring to FIG. 3, an audio input signal is divided into positive and negative portions to amplify the positive and negative portions, and the amplified positive and negative portions are again power amplified in accordance with the levels of the amplified results (operations 40–42), and the power amplified results are combined to obtain an audio output signal (operation 44)

In operation 40, the preamplifier 20 of the b-th power amplifying terminal 10, . . . , or 12 of FIG. 2 divides an AC audio input signal received from the outside device via the input terminal IN into positive and negative portions, amplifies the divided positive and negative portions, and outputs amplified positive and negative portions 30 and 32 to the power amplifier 24 as preamplified positive and negative portions. In this case, the preamplifier 20 can vary an amplification factor in response to an audio output signal fed back from the signal synthesizer 26.

After operation 40, the power amplifier 24 selects a positive supply voltage having a level proportional to a level of the preamplified positive portion 30 among first through M-th positive voltages $+V_1$ through $+V_M$ ($M \geq 3$) which are output from the power supply 22, and selects a negative supply voltage having a level proportional to the level of the preamplified negative portion 32 among first through M-th negative voltages $-V_1$ through $-V_M$. Also, the power amplifier 24 amplifies the preamplified positive and negative portions 30 and 32 again in response to the selected positive and negative supply voltages, respectively, and outputs the amplified positive and negative portions to the signal synthesizer 26 as power amplified positive and negative portions 34 and 36 (operation 42 ). To accomplish this, the power supply 22 outputs the first through M-th positive voltages $+V_1$ through $+V_M$ having different levels and the first through M-th negative voltages $-V_1$ through $-V_M$ having different levels to the power amplifier 24. In this case, the level $|V_A|$ ($1 \leq A \leq M$) of each supply voltage becomes lower from the first to the M-th voltages. That is, $|V_1|>|V_2|>|V_3|> \ldots , |V_{M-2}|>|V_{M-1}|>|V_M|$.

After operation 42, the signal synthesizer 26 combines the power amplified positive and negative portions 34 and 36 and outputs the combined result as an audio output signal via the output terminal $OUT_b$ (operation 44). Consequently, the audio power amplifying apparatus and method according to the present invention shown in FIG. 2 and 3, respectively, enable the power of an audio input signal to be amplified in a push-pull type of method.

Figure 4:
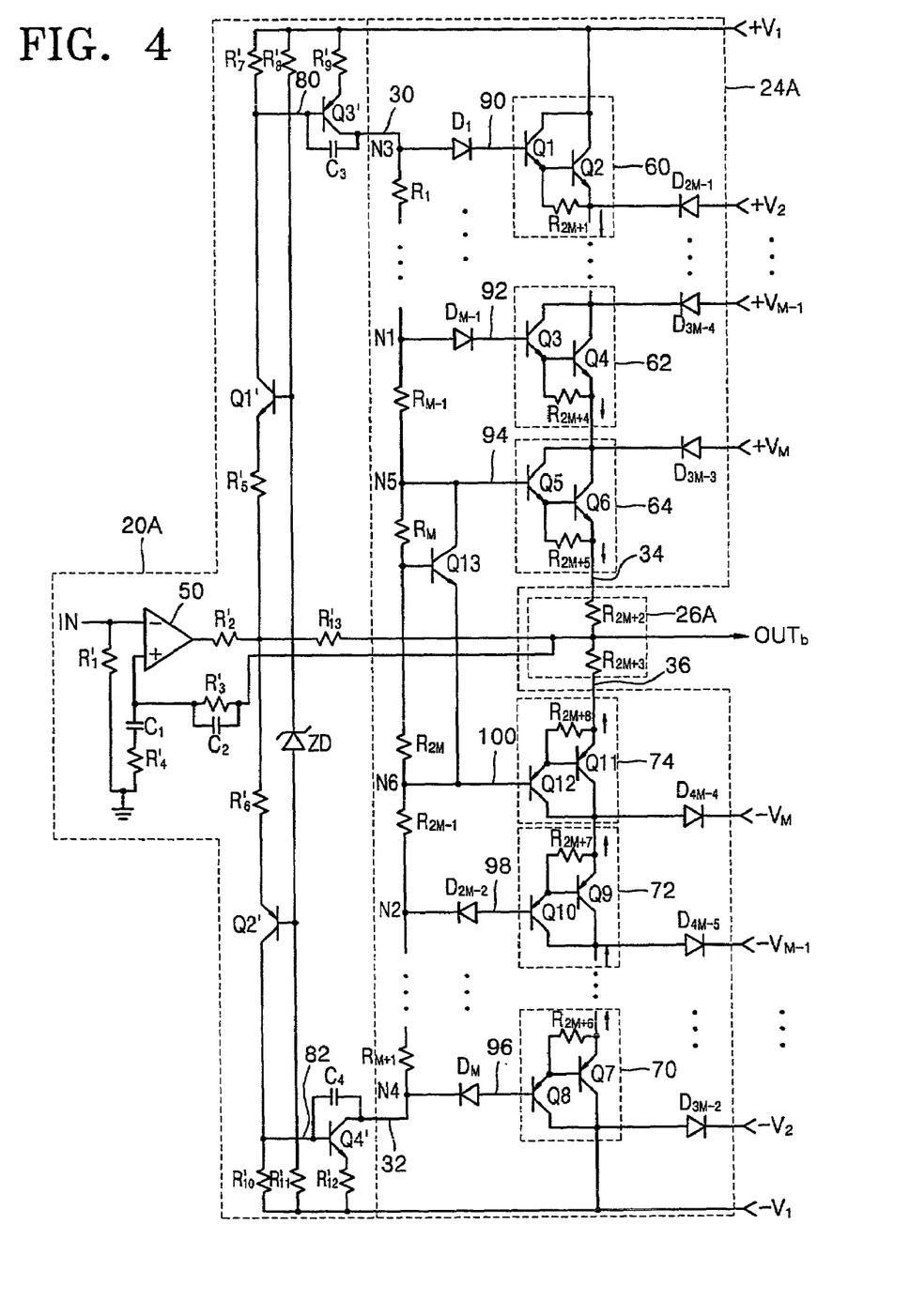
FIG. 4 is a circuit diagram showing embodiments of the preamplifier, the power amplifier, and the signal synthesizer of FIG. 2 according to an embodiment of the present invention.

The configuration and operation of an embodiment of the b-th power amplifying terminal 10, . . . , or 12 of FIG. 2 according to the present invention will now be described with reference to FIG. 4. FIG. 4 is a circuit diagram showing embodiments 20A, 24A, and 26A of the preamplifier 20, the power amplifier 24, and the signal synthesizer 26 of FIG. 2 according to the present invention, respectively. Referring to FIG. 4, the circuit includes a preamplifier 20A, a power amplifier 24A, and a signal synthesizer 26A.

The preamplifier 20A includes resistors $R_1'$–$R_{13}'$, capacitors C1–C4, an operational amplifier 50, a Zener diode ZD, and transistors $Q1'$–$Q4'$. The resistor $R_1'$ is connected to a negative input terminal of the operational amplifier 50 and is an input bias resistor to bias the negative input terminal to a zero potential. In this case, a negative feedback capacitor C1 and the resistor $R_4'$ determine the lower cutoff frequency $f_L$ as expressed by Equation (1):

$$f_L = \frac{1}{2\pi C1 \cdot R_4'} \tag{1}$$

The resistors $R_3'$ and $R_4'$ shown in FIG. 4 determine a voltage gain amplified by the operational amplifier 50, and the capacitors C2, C3, and C4 prevent oscillation. The resistor $R_2'$ matches impedances, and the resistor $R_{13}'$ stabilizes the amplification factors of the first through M-th current amplifiers 60–74. A constant-current source includes the transistors $Q1'$ and $Q2'$, the Zener diode ZD, and the resistors $R_5'$, $R_6'$, $R_8'$, and $R_{11}'$ control the base current of pre-drive transistors $Q3'$ and $Q4'$. Here, the resistors $R_7'$, $R_9'$, $R_{10}'$, and $R_{12}'$ are provided to bias the transistors $Q3'$ and $Q4'$.

The power amplifier 24A shown in FIG. 4 includes first through 2M-th resistors $R_1$ through $R_{2M}$, which are connected in series between the preamplified positive portion 30 and the preamplified negative portion 32, first through 4M-4-th diodes $D_1$–$D_{4M-4}$, first through 2M-th current amplifiers 60, . . . , 62, 64, 70, . . . , 72, and 74, and a transistor Q13. Here, the first through M-th current amplifiers 60, . . . , 62, and 64 are connected to each other in series and to the first through M-th positive voltages $+V_1$–$+V_M$, respectively, output from the power supply 22. For example, the first current amplifier 60 is connected to the first voltage $+V_1$ having the highest positive level, which is output from the power supply 22, the M−1-th current amplifier 62 is connected to the positive M−1-th voltage $+V_{M-1}$ having the next lowest positive level, which is output from the power supply 22, and the M-th current amplifier 64 is connected to the M-th positive voltage $+V_M$ having the lowest positive level, which is output from the power supply 22.

In this case, the M+1-th through 2M-th current amplifiers 70, ..., 72, and 74 are connected in series to each other and to the first through M-th negative voltages $-V_1$ through $-V_M$, respectively, output from the power supply 22. For example, the M+1-th current amplifier 70 is connected to the first negative voltage $-V_1$ having the lowest negative level, which is output from the power supply 22, the 2M-1-th current amplifier 72 is connected to the M-1-th negative voltage $-V_{M-1}$ having the next highest negative level, which is output from the power supply 22, and the 2M-th current amplifier 74 is connected to the M-th negative voltage $-V_M$ having the highest negative level, which is output from the power supply 22.

To this end, each of the first through 2M-th current amplifiers 60, ..., 62, 64, 70, ..., 72, and 74 is configured to have a first transistor Q1, ..., Q3, Q5, Q8, ..., Q10, or Q12, a second transistor Q2, ..., Q4, Q6, Q7, ..., Q9, or Q11, and a bias resistor $R_{2M+1}$, ... $R_{2M+4}$, $R_{2M+5}$, $R_{2M+6}$, ..., $R_{2M+7}$, or $R_{2M+8}$. That is, each of the first through 2M-th current amplifiers 60, ..., 62, 64, 70, ..., 72, and 74 can have a Darlington configuration.

Here, the first transistor Q1, ..., Q3, Q5, Q8, ..., Q10, or Q12 has a base, which connected to a corresponding bias input port 90, ..., 92, 94, 96, ..., 98 or 100, and a collector which is connected to a corresponding positive or negative voltage $+V_1$, ..., $+V_{M-1}$, $+V_M$, $-V_1$, ..., $-V_{M-1}$, or $-V_M$. In this case, one side of the bias resistor $R_{2M+1}$, ..., $R_{2M+4}$, $R_{2M+5}$, $R_{2M+6}$, ..., $R_{2M+7}$, or $R_{2M+8}$ is connected to an emitter of the first transistor Q1, ..., Q3, Q5, Q8, ..., Q10, or Q12. The second transistor Q2, ..., Q4, Q6, Q7, ..., Q9, or Q11 has a base, which is connected to the emitter of the first transistor Q1, ..., Q3, Q5, Q8, ..., Q10, or Q12, and a collector and an emitter which are connected between the collector of the first transistor Q1, ..., Q3, Q5, Q8, ..., Q10, or Q12 and the other side of the bias resistor $R_{2M+1}$, ..., $R_{2M+4}$, $R_{2M+5}$, $R_{2M+6}$, ..., $R_{2M+7}$, or $R_{2M+8}$.

The operation of the first through 2M-th current amplifiers 60, ..., 62, 64, 70, ..., 72, and 74 having the configuration described above will now be described. The first current amplifier 60 is biased in response to a voltage at a third node N3 between the first resistor $R_1$ and the preamplified positive portion 30. In this case, the m-th current amplifier ($2 \leq m \leq M-1$) is biased in response to a voltage at a first node N1 between the m-1-th resistor $R_1$, ..., or $R_{M-2}$ and the m-th resistor $R_2$, ..., or $R_{M-1}$ to amplify the current output from the m-1-th current amplifier and output the amplified current to the m+1-th current amplifier. The M-th current amplifier 64 is biased in response to a voltage at a fifth node N5 between the M-1-th resistor $R_{M-1}$ and the M-th resistor $R_M$ to amplify the current output from the M-1-th current amplifier 62 and output the amplified current to the signal synthesizer 26A as the power amplified positive portion 34. The M+1-th current amplifier 70 is biased in response to a voltage at a fourth node N4 between the M+1-th resistor $R_{M+1}$ and the preamplified negative portion 32. In this case, the M+m current amplifier is biased in response to a voltage at a second node N2 between the M+m-1-th resistor $R_{M+1}$, ..., or $R_{2M-2}$ and the M+m-th resistor $R_{M+2}$, ..., or $R_{2M-1}$ to amplify the current output from the M+m-1 current amplifier and to output the amplified current to the M+m+1-th current amplifier. The 2M-th current amplifier 74 is biased in response to a voltage at a sixth node N6 between the 2M-1-th resistor $R_{2M-1}$ and the 2M-th resistor $R_{2M}$ to amplify the current output from the 2M-1-th current amplifier 72 and to output the amplified current to the signal synthesizer 26A as the power amplified negative portion 36.

For example, if m equals M-1, the M-1-th current amplifier 62 is biased in response to a voltage at a first node N1 between the M-2-th resistor $R_{M-2}$ and the M-1-th resistor $R_{M-1}$ to amplify the current input from an M-2-th current amplifier (not shown) in a direction indicated by an arrow and to output the amplified current to the M-th current amplifier 64 in the direction indicated by an arrow. In this case, the 2M-1-th current amplifier 72 is biased in response to a voltage at a second node N2 between the 2M-2-th resistor $R_{2M-2}$ and the 2M-1-th resistor $R_{2M-1}$ to amplify the current input from a 2M-2-current amplifier (not shown) in a direction indicated by an arrow and to output the amplified current to the 2M-th current amplifier 74 in a direction indicated by an arrow. Therefore, it can be noted that the operation start level of the first through 2M-th current amplifiers 60, ..., 62, 64, 70, ..., 72, and 74 is determined by the first through 2M-th resistors $R_1$ through $R_{2M}$ and the first through 2M-th voltages $+V_1$, ..., $+V_{M-1}$, $+V_M$, $-V_1$, ..., $-V_{M-1}$, and $-V_M$.

The first diode $D_1$ has an anode and a cathode coupled to a third node N3 and the bias input port 90 of the first current amplifier 60, respectively, and the second diode $D_M$ has a cathode and an anode coupled to the fourth node N4 and the bias input port 96 of the M+1-th current amplifier 70, respectively. The m+1-th diode, which is one of the third through M-th diodes, has an anode and a cathode coupled to the first node N1 and a bias input port of the m-th current amplifier, respectively. Similarly, the M+m-1-th diode, which is one of the M+1-th through 2M-2-th diodes, has a cathode and an anode coupled to the second node N2 and a bias input port of the M+m current amplifier, respectively.

For example, if m equals M-1, the M-th diode $D_M$ has an anode and a cathode coupled to the first node N1 and the bias input port 92 of the M-1-th current amplifier 62, respectively, and the 2M-2-th diode $D_{2M-2}$ has a cathode and an anode coupled to the second node N2 and the bias input port 98 of the 2M-1-th current amplifier 72, respectively.

The first through 2M-2-th diodes $D_1$ through $D_{2M-2}$ having the configuration described above prevent the base-emitter voltage of each of the first transistors Q1, ..., Q1, Q3, Q5, Q8, ..., Q10, and Q12 from exceeding a normal or threshold value. The absence of the first through 2M-2-th diodes $D_1$ through $D_{2M-2}$ may cause a Zener breakdown at an emitter-base junction of each of the first transistors Q1, ..., Q3, Q5, Q8, ..., Q10, and Q12, thereby causing the first transistors not to operate.

Furthermore, the x-th diode ($2M-1 \leq x \leq 3M-3$), which is one of the 2M-1-th through 3M-3-th diodes $D_{2M-1}$, ..., $D_{3M-4}$, and $D_{3M-3}$, has an anode and a cathode coupled to the outputs of x-2M+3-th positive voltage $+V_2$, ..., $+V_{M-1}$, or $+V_M$ and x-2M+2-th current amplifier 60, ..., or 62, respectively. For example, if x=3M-3, the 3M-3-th diode $D_{3M-3}$ has an anode and a cathode coupled to the outputs of the M-th positive voltage $+V_M$ and the M-1-th current amplifier 62, respectively. The y-th diode ($3M-2 \leq y \leq 4M-4$), which is one of the 3M-2-th through 4M-4-th diodes $D_{3M-2}$, ..., $D_{4M-5}$, and $D_{4M-4}$, has a cathode and an anode coupled to the outputs of the y-3M+4-th negative voltage $-V_2$, ..., $-V_{M-1}$, or $-V_M$ and the y-2M+3-th current amplifier 70, ..., or 72, respectively. For example, if y =4M-4, the 4M-4-th diode $D_{4M-4}$ has a cathode and an anode coupled to the outputs of the M-th negative voltage $-V_M$ and the 2M-1-th current amplifier 72, respectively.

The 2M−1-th through 4M−4-th diodes $D_{2M-1}, \ldots,$ and $D_{4M-4}$ having the configuration described above prevent a reverse flow of current. For example, the x-th diode prevents reverse flow of current when the level of the output of the x−2M+2-th current amplifier 60, . . . , or 62 is higher than that of the x−2M+3-th positive voltage $+V_2, \ldots, +V_{M-1}$, or $+V_M$. The y-th diode prevents reverse flow of current when the level of the y−3M+4-th negative voltage $-V_2, \ldots,$ $-V_{M-1}$, or $-V_M$ is higher than that of the output of the y−2M+3-th current amplifier 70, . . . , or 72.

The signal synthesizer 26A includes of resistors $R_{2M+2}$ and $R_{2M+3}$ connected in series between the power amplified positive portion 34 output from the M-th current amplifier 64 in a direction indicated by an arrow and the power amplified negative portion 36 output from the 2M-th current amplifier 74 in a direction indicated by an arrow. Here, the resistors $R_{2M+2}$ and $R_{2M+3}$ prevent occurrences of overcurrent. That is, the resistors $R_{2M+2}$ and $R_{2M+3}$ prevent parameters of the first and second transistors of each current amplifier 60, . . . , 62, 64, 70, . . . , 72, or 74, such as current amplification gain, from being affected by environmental conditions such as temperature. In this case, an audio output signal is output from between the resistors $R_{2M+2}$ and $R_{2M+3}$ via an output terminal $OUT_b$.

In order to compensate for the temperature, the power amplifier 24A of the b-th power amplifying terminal 10, . . . , or 12 shown in FIG. 4 further includes the transistor Q13 having a base connected between the M-th and 2M-th resistors $R_M$ and $R_{2M}$ and a collector and an emitter connected between the fifth and sixth node N5 and N6, respectively.

The operation of the audio power amplifying apparatus according to the embodiment of the present invention including the preamplifier 20A, the power amplifier 24A, and the signal synthesizer 26A shown in FIG. 4 will now be described in more detail. First, an audio input signal is input through the input terminal IN and is amplified in the operational amplifier 50. The amplified signal is provided to transistors Q1' and Q2' through resistors $R_2', R_5',$ and $R_6'$. Thus, the positive portion of the audio input signal amplified by the operational amplifier 50 is applied to the base of transistor Q3', and the negative portion thereof is applied to a base of transistor Q4'. In this case, the transistor Q3' amplifies the positive portion of the audio input signal applied to its base and outputs the amplified result 30 to the power amplifier 24A as a preamplified positive portion. The transistor Q4' amplifies the negative portion of the audio input signal applied to its base and outputs the amplified result 32 to the power amplifier 24A as a preamplified negative portion.

The first through M-th resistors $R_1$ through $R_M$, the first and the third through M-th diodes $D_1$ and $D_3-D_M$, and the first through M-th current amplifiers 60, . . . , 62, and 64 of the power amplifier 24A power-amplify only the preamplified positive portion 30 and output the power amplified positive portion 34 to the signal synthesizer 26A. The M+1-th through 2M-th resistors $R_{M+1}$ through $R_{2M}$, the second and the M+1-th through 2M−2-th diodes $D_2$ and $D_{M+1}-D_{2M-2}$, and the M+1-th through 2M-th current amplifiers 70, . . . , 72, and 74 of the power amplifier 24A power-amplify only the preamplified negative portion 32 and output the power amplified negative portion 36 to the signal synthesizer 26A.

Figure 5:
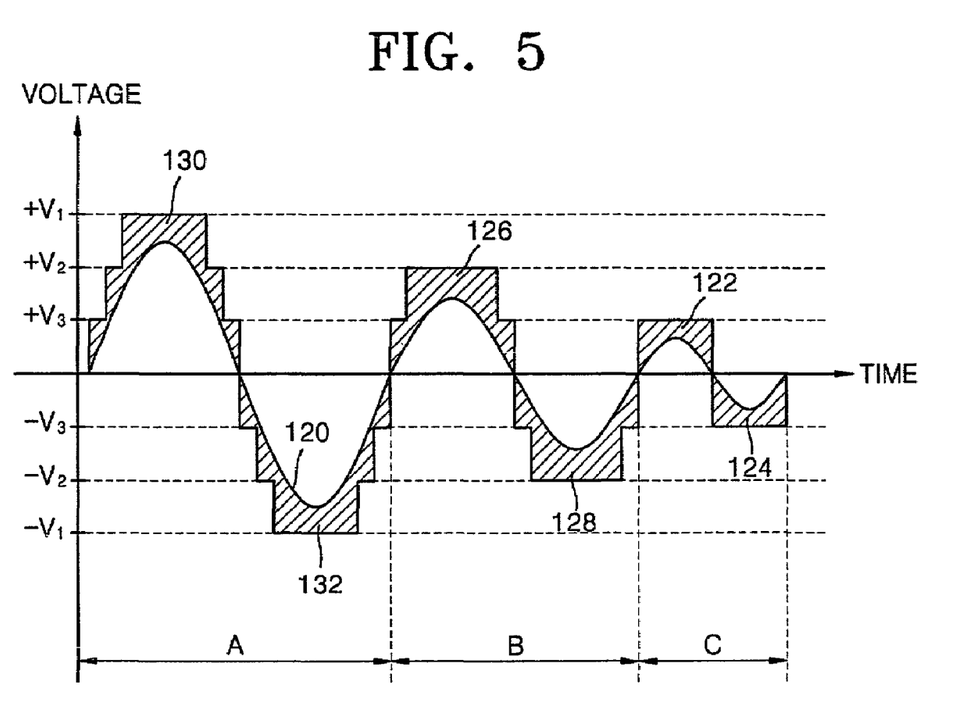
FIG. 5 is a graph to explain an exemplary operation of the audio power amplifying apparatus of FIG. 4.

For ease of understanding, assuming that M equals 3, an exemplary operation of the audio power amplifying apparatus according to the present invention having the preamplifier 20A, the power amplifier 24A, and the signal synthesizer 26A will now be described. FIG. 5 is a voltage-time graph for explaining the exemplary operation of the audio power amplifying apparatus of FIG. 4. Here, the voltage denotes a positive or negative supply voltage supplied to the power amplifier 24A. An analog signal 120 represents the positive and negative portions preamplified by the preamplifer 20A.

If the preamplified positive and negative portions 30 and 32 exist between $+V_3$ and $-V_3$ (interval C) as shown in FIG. 5, the third and sixth current amplifiers 64 and 74 operate while the first, second, fourth, and fifth current amplifiers 60, 62, 70 and 72 do not operate. This is because transistors Q2, Q4, Q7, and Q9 are in a high impedance state. For example, as shown in FIG. 5, the third positive voltage $+V_3$ is selected among the first through third positive voltages $+V_1$ through $+V_3$ as a positive supply voltage, and the third negative voltage $-V_3$ is selected among the first through third negative voltages $-V_1$ through $-V_3$ as a negative supply voltage. In this case, the power amplifier 24A power-amplifies the positive and negative portions 30 and 32 in response to the third positive and negative voltages $+V_3$ and $-V_3$, respectively. Thus, as shown in interval C of FIG. 5, the third positive and negative voltages $+V_3$ and $-V_3$ are supplied as positive and negative supply voltages to reduce power loss (shadowed portions) 122 and 124 as compared to supplying $+V_1$ or $+V_2$ and $-V_1$ or $-V_2$ as the positive and negative supply voltages, respectively.

If the preamplified positive and negative portions 30 and 32 exist between $+V_3$ and $+V_2$ and between $-V_2$ and $-V_3$ (interval B) as shown in FIG. 5, the second and fifth current amplifiers 62 and 72 operate while the first, third, fourth, and sixth current amplifiers 60, 64, 70 and 74 do not operate. This is because the transistors Q2 and Q7 are in a high impedance state and the third positive and negative voltages $+V_3$ and $-V_3$ are cut off by the sixth and eighth diodes $D_{3M-3}$ and $D_{4M-4}$. For example, as shown in FIG. 5, the second positive voltage $+V_2$ is selected among the first through third positive voltages $+V_1$ through $+V_3$ as a positive supply voltage, and the second negative voltage $-V_2$ is selected among the first through third negative voltages $-V_1$ through $-V_3$ as a negative supply voltage. In this case, the power amplifier 24A power-amplifies the preamplified positive and negative portions 30 and 32 in response to the second positive and negative voltages $+V_2$ and $-V_2$, respectively. Thus, as shown in interval B of FIG. 5, the second positive and negative voltages $+V_2$ and $-V_2$ are supplied as positive and negative supply voltages to reduce power loss (shadowed portions) 126 and 128 compared to supplying $+V_1$ and $-V_1$ as positive and negative supply voltages, respectively.

If the preamplified positive and negative portions 30 and 32 exist between $+V_2$ and $+V_1$ and between $-V_1$ and $-V_2$ (interval A) as shown in FIG. 5, the first and fourth current amplifiers 60 and 70 operate while the second, third, fifth, and sixth current amplifiers 62, 64, 72 and 74 do not operate. This is because the transistors Q4, Q6, Q9, and Q11 are in a saturated state, the second positive and negative voltages $+V_2$ and $-V_2$ are cut off by the seventh and ninth diodes $D_{2M-1}$ and $D_{3M-2}$, and the third positive and negative voltages $+V_3$ and $-V_3$ are cut off by the sixth and eighth diodes $D_{3M-3}$ and $D_{4M-4}$. For example, as shown in FIG. 5, the first positive voltage $+V_1$ is selected among the first through third positive voltages $+V_1$ through $+V_3$ as a positive supply voltage, and the first negative voltage $-V_1$ is selected among the first through third negative voltages $-V_1$ through $-V_3$ as a negative supply voltage. In this case, the power amplifier 24A power-amplifies the positive and negative portions 30 and 32 in response to the first positive and negative voltages +$V_1$ and −$V_1$, respectively. Thus, as shown in interval A of FIG. 5, the power losses (shadowed portions) 130 and 132 occur when supplying the first positive and negative voltages +$V_1$ and −$V_1$.

That is, the audio power amplifying apparatus and method according to the present invention automatically determines the positive and negative supply voltages linearly according to the level of an audio input signal, and amplifies the power of the audio input signal using the determined supply voltages.

As described above, unlike a conventional audio amplifying apparatus, the audio power amplifying apparatus and method according to the present invention do not require a separate comparator to detect the level of an audio input signal, thereby reducing the manufacturing cost and a chip size when it is implemented by a single chip. Furthermore, the present invention linearly selects a voltage supplied from the power supply, thereby preventing the high frequency noise due to switching of the comparator used in the conventional audio power amplifying apparatus while reducing distortion. Additionally, the present invention can increase the number of levels of supply voltages to be selected by providing additional transistors for a current amplifier.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An audio power amplifying apparatus including first through B-th power amplifying terminals, each of which power-amplifies an input alternating current (AC) audio input signal and outputs a power amplified result as an audio output signal, wherein a b-th amplifying terminal ($1 \leq b \leq B$) comprises:
    a preamplifier that divides the audio input signal into positive and negative portions, preamplifies the positive and negative portions, and outputs the preamplified positive and negative portions;
    a power supply to supply positive and negative voltages having different levels;
    a power amplifier that selects one of the positive supply voltages having a level proportional to a level of the preamplified positive portion and one of the negative supply voltages having a level proportional to the level of the preamplified negative portion, amplifies the preamplified positive and negative portions using the selected one of the positive and negative supply voltages, respectively, and outputs the amplified positive and negative portions; and
    a signal synthesizer that combines the amplified positive and negative portions output from the power amplifier and outputs the combined result as the audio output signal,
    wherein said amplifier comprises current amplifiers, each of which is connected to a corresponding one of the positive and negative supply voltages,
    the preamplified positive portion is amplified using one of the current amplifiers that is connected to the one of the positive supply voltages that is proportional to the preamplified positive portion, and
    the preamplified negative portion is amplified using another one of the current amplifiers that is connected to the one of the negative supply voltages that is proportional to the preamplified negative portion.

2. The apparatus of claim 1, wherein:
said power amplifier comprises:
    first through M-th current amplifiers that are connected in series to each other and which are supplied with first through M-th positive voltages, respectively,
    M+1-th through 2M-th current amplifiers that are connected in series to each other and which are supplied with first through M-th negative voltages, respectively, and
    first through 2M-th resistors that are connected in series with each other between the preamplified positive and negative portions,
    the m-th current amplifier is biased in response to a voltage at a first node between the m−1-th resistor and the m-th resistor to amplify a current output from the m−1-th current amplifier and to output the amplified current to the m+1-th current amplifier, where $2 \leq m \leq M-1$,
    the M+m current amplifier is biased in response to a voltage at a second node between the M+m−1-th resistor and the M+m-th resistor to amplify a current output from the M+m−1 current amplifier and to output the amplified current to the M+m+1-th current amplifier,
    the first current amplifier is biased in response to a voltage at a third node between the first resistor and the preamplified positive portion,
    the M+1-th current amplifier is biased in response to a voltage at a fourth node between the M+1-th resistor and the preamplified negative portion,
    the M-th current amplifier is biased in response to a voltage at a fifth node between the M−1-th resistor and the M-th resistor to amplify a current output from the M−1-th current amplifier and to output the amplified current to the signal synthesizer as the amplified positive portion, and
    the 2M-th current amplifier is biased in response to a voltage at a sixth node between the 2M−1-th resistor and the 2M-th resistor to amplify a current output from the 2M−1-th current amplifier and to output the amplified current to the signal synthesizer as the amplified negative portion.

3. The apparatus of claim 2, wherein each of the first through 2M-th current amplifiers comprises:
    a first transistor having an emitter, a base connected to a bias input port, and a collector connected to a corresponding one of the positive and negative voltages,
    a 2M+1-th resistor, one side of which is connected to the emitter of the first transistor, and
    a second transistor having a base which is connected to the emitter of the first transistor, a collector connected to the collector of the first transistor and an emitter which is connected to another side of the 2M+1-th resistor.

4. The apparatus of claim 3, wherein:
said power amplifier further comprises:
    a first diode having an anode and a cathode coupled to the third node and a bias input port of the first current amplifier, respectively,
    a second diode having a cathode and an anode coupled to the fourth node and a bias input port of the M+1-th current amplifier, respectively, and
    third through 2M−2-th diodes, wherein the m+1-th diode has an anode and a cathode coupled to the first node and a bias input port of the m-th current amplifier, respectively, and the M+m−1-th diode has a cathode and an anode coupled to the second node and a bias input port of the M+m current amplifier, respectively.

5. The apparatus of claim 4, wherein:
said power amplifier further comprises 2M−1-th through 4M−4-th diodes,
an x-th diode has an anode and a cathode coupled to the x−2M+3-th positive voltage and output of the x−2M+2-th current amplifier, respectively, where $2M-1 \leq x \leq 3M-3$, and
a y-th diode has a cathode and an anode coupled to the y−3M+4-th negative voltage and output of the y−2M+3-th current amplifier, respectively, where $3M-2 \leq y \leq 4M-4$.

6. The apparatus of claim 5, wherein the b-th power amplifying terminal further comprises a third transistor having a base connected between the M-th resistor and the 2M-th resistor, and a collector and an emitter connected between the fifth and sixth nodes.

7. The apparatus of claim 6, wherein:
said signal synthesizer comprises 2M+2-th and 2M+3-th resistors connected in series to each other between the amplified positive and negative portions output from the M-th and 2M-th current amplifiers, respectively, and
the audio output signal is output from between the 2M+2-th and 2M+3-th resistors.

8. The apparatus of claim 2, wherein said preamplifier changes an amplification factor in response to the audio output signal output from said signal synthesizer.

9. A power amplifying apparatus to amplify an input signal to be output as an amplified signal, comprising:
a splitting unit that splits the input signal into positive and negative signal portions;
a power supply to supply voltages;
an amplifier to match ones of the signal portions with corresponding ones of the supply voltages and to amplify the signal portions using the corresponding supply voltages; and
a signal synthesizer to receive the amplified signal portions and to combine the amplified signal portions as the amplified signal,
wherein said power supply supplies positive and negative supply voltages of different values,
said amplifier amplifies the positive signal portion using one of the positive supply voltages that is proportional to the positive signal portion, and amplifies the negative signal portion using one of the negative supply voltages that is proportional to the negative signal portion,
said amplifier further comprises current amplifiers, each of which is connected to a corresponding one of the positive and negative supply voltages, the positive signal portion is amplified using one of the current amplifiers that is connected to the one of the positive supply voltages that is proportional to the positive signal portion, and
the negative signal portion is amplified using another one of the current amplifiers that is connected to the one of the negative supply voltages that is proportional to the negative signal portion.

10. The power amplifying apparatus of claim 9, wherein said amplifier matches the ones of the supply voltages that are proportional to the corresponding ones of the signal portions.

11. The power amplifying apparatus of claim 9, wherein said splitting unit further amplifies the input signal.

12. The power amplifying apparatus of claim 11, wherein said splitting unit amplifies the input signal in accordance with the amplified signal output from said signal synthesizer.

13. The power amplifying apparatus of claim 9, wherein the remaining ones of the current amplifiers do not amplify the positive and negative signal portions.

14. The power amplifying apparatus of claim 13, wherein the current amplifiers are connected in series with each other and each of the current amplifiers is a circuit in a Darlington configuration.

15. A power amplifying apparatus to amplify an input signal to be output as amplified signals to different devices, comprising:
an input terminal to receive the input signal; and
power amplifying terminals to receive the input signal from said input terminal and to output amplified signals to the different devices,
wherein each said power amplifying terminal comprises
a splitting unit that splits the input signal into positive and negative signal portions,
a power supply to positive and negative supply voltages of different values,
an amplifier, having current amplifiers, each of which is connected to a corresponding one of the positive and negative supply voltages, the positive signal portion being amplified using one of the current amplifiers that is connected to the one of the positive supply voltages that is proportional to the positive signal portion, and the negative signal portion is amplified using another one of the current amplifiers that is connected to the one of the negative supply voltages that is proportional to the negative signal portion, and
a signal synthesizer to receive the amplified signal portions and to combine the amplified signal portions as the amplified signal to be output to the corresponding one of the different devices.

* * * * *